(12) United States Patent
Chang

(10) Patent No.: US 7,423,879 B2
(45) Date of Patent: Sep. 9, 2008

(54) SLEEVE-TIGHTENING HEAT DISSIPATING MODULE

(75) Inventor: Tang-Kuei Chang, Wugu Township, Taipei County (TW)

(73) Assignee: Neng Tyi Precision Industries Co., Ltd., Taipei County (TW)

( * ) Notice: Subject to any disclaimer, the term of this patent is extended or adjusted under 35 U.S.C. 154(b) by 70 days.

(21) Appl. No.: 11/443,049

(22) Filed: May 31, 2006

(65) Prior Publication Data

US 2007/0279869 A1  Dec. 6, 2007

(51) Int. Cl.
*H05K 7/20* (2006.01)
(52) U.S. Cl. ............... 361/704; 165/80.3; 165/185; 257/712
(58) Field of Classification Search ............... None
See application file for complete search history.

(56) References Cited

U.S. PATENT DOCUMENTS

| | | | | |
|---|---|---|---|---|
| 4,246,597 A * | 1/1981 | Cole et al. | ............... | 257/713 |
| 6,199,625 B1 * | 3/2001 | Guerrero | ............... | 165/80.3 |
| 6,330,908 B1 * | 12/2001 | Lee et al. | ............... | 165/185 |
| 6,479,895 B1 * | 11/2002 | Lee et al. | ............... | 257/720 |
| 6,671,172 B2 * | 12/2003 | Carter et al. | ............... | 361/697 |
| 6,927,979 B2 * | 8/2005 | Watanabe et al. | ............... | 361/697 |
| 7,142,422 B2 * | 11/2006 | Lee et al. | ............... | 361/695 |
| 7,142,430 B2 * | 11/2006 | Lee et al. | ............... | 361/719 |
| 7,283,362 B2 * | 10/2007 | Lin et al. | ............... | 361/704 |
| 2005/0088823 A1 * | 4/2005 | Kabadi et al. | ............... | 361/704 |
| 2006/0213642 A1 * | 9/2006 | Lai | ............... | 165/80.3 |

* cited by examiner

*Primary Examiner*—Boris L Chervinsky
(74) *Attorney, Agent, or Firm*—Troxell Law Office, PLLC

(57) ABSTRACT

A sleeve-tightening heat dissipating module includes a pillar, a sleeve, a stand, and heat sinks, wherein the pillar is a cylinder with a wider lower part, and the sleeve can be enclosed at a circumference of the pillar and is provided with a chimb at its bottom rim for allowing the stand and heat sinks to be sheathed on it. As an inner diameter of wider part of the sleeve is smaller than an outer diameter of wider part at lower end of the pillar, the sleeve will be locked on a top end of wider part of the pillar upon assembling. If the sleeve is pressed downward, the sleeve can be expanded outward to tighten the heat sinks, so as to be assembled and fixed with the heat sinks, without a need to paste with a glue, to weld, and to anodize.

4 Claims, 6 Drawing Sheets

SLEEVE-TIGHTENING HEAT DISSIPATING MODULE

BACKGROUND OF THE INVENTION (a) Field of the Invention

The present invention relates to a sleeve-tightening heat dissipating module and more particularly to a heat dissipating module wherein a sleeve is expanded to tighten heat sinks for fixing into an integral body, which is easy to assemble, can save a labor time and reduce a manufacturing process, can increase a speed of manufacturing, and is provided with an eco-function.

(b) Description of the Prior Art

To avoid a damage to electronic parts in an interior of computer host due to an excessive rise of temperature from an accumulation of large amount of heat during an operation of the computer, which will in turn affect a stability in operating the computer, a heat dissipating device is normally installed on the electronic part to expel a heat source for maintaining a stability of the electronic part. Referring to FIG. 1, a conventional heat dissipating device is primarily composed of a base plate 1 and a plurality of heat sinks 2, wherein the base plate 1 is provided with screw holes 11 which can be fixed with pre-built screw holes on a motherboard through bolts. The heat sinks 2 are assembled on a top end of the base plate 1 to expel heat when the base plate 1 is affixed on a top surface of heat-generating electronic part for absorbing and conducting the heat source. In assembling the heat dissipating device, the plural heat sinks 2 are assembled into a unit and then glued with the base plate 1 to accomplish the assembling, after pasting the glue on a bottom of the heat sinks 2. However, the glue is often pasted non-uniformly or is even pasted too much such that it will be exuded in putting the glue on this kind of heat dissipating device. Therefore, a post-processing operation should be additionally required in assembling, which results in a very inconvenient manufacturing process. Furthermore, the base plate 1 will be separated with the heat sinks 2 due to a high temperature generated by absorbing the heat in a long term of usage, which will also influence the effect of heat dissipating. Accordingly, to have a better fixation and heat dissipating effect for the assembly of base plate 1 and heat sinks 2, there are vendors who assemble the heat sinks 2 and the base plate 1 by a welding method. Although this kind of method can improve a compactness of assembling and prevent a problem of separation, a layer of nickel should be first anodized on a metallic material during welding, which enables the assembling operation to additionally incorporate an anodizing process, and is easy to pollute air and environment for jeopardizing a health of assembling personnel as well as impacting and destroying the environment, due to waste water and waste gas generated in the processes of anodizing and welding. Accordingly, this kind of technique does not truly effectively solve the inconvenience in assembling and the shortcomings of the heat dissipating device. In addition, there is another kind of heat dissipating device in the market wherein heat pipes are used to transfix and tighten heat sinks. Referring to FIG. 2, this kind of heat dissipating device is provided with a base plate 3, heat pipes 4, and heat sinks 5, wherein the heat sinks 5 are provided with through-holes 51. As the heat dissipating device is made by aluminum, the heat pipes 4 are first anodized with nickel and then soldered on the base plate 3, followed by sheathing the heat sinks 5 onto the heat pipes 4 to accomplish the assembling. Due to that the heat sinks 5 are positioned by a tightening at ends of heat pipes 4 and a friction of the through-holes 51, the heat sinks 5 are easily worn out, thereby affecting the strength of assembling. In addition, a reliability of heat transfer will be decreased, and the waste water and the waste gas produced in the processes of anodizing and welding will also impact and destroy the environment.

SUMMARY OF THE INVENTION

In view of the shortcomings in an assembly design for the conventional heat dissipating device, which results in an inconvenience in manufacturing and assembling, a high cost, and an inability to increase a productivity; in particular, being strongly felt that a manufacturing of heat sinks is not only important to the entire environment, but also is having a great influence to the environment; therefore, a sleeve-tightening heat dissipating module is finally invented after a continuous research and improvement to work out a solution for the aforementioned shortcomings, so as to eliminate the drawbacks of conventional device, effectively solve the problems in assembling the heat sinks, and achieve a better productivity.

Accordingly, the sleeve-tightening heat dissipating module of present invention includes primarily a pillar, a sleeve, a stand, and a plurality of heat sinks, wherein the pillar is made by a solid metal and is a cylinder which is narrower at an upper part and wider at a lower part; the sleeve is a hollow metallic cylindrical tube, is narrower at an upper part and wider at a lower part for enclosing the pillar, and is provided with an inner diameter which is smaller than an outer diameter of a wider part of the pillar, such that it can be only locked on a top end of circumference of wider part of the pillar, yet can be still provided with a certain flexibility for expansion, upon enclosing the pillar; a bottom rim of the sleeve is provided with a chimb forming into a flange on which can be sheathed and stacked with the stand and heat sinks; the stand is used to be fixed on an electronic part which is assembled on a motherboard, and a center of which is provided with a round frame which can be exactly sheathed on the chimb of sleeve; and the heat sinks, which are also provided with circular frames, are stacked into a module by a multiple punching, and then are sheathed on a circumference of the sleeve and on a top end of the stand, for expelling heat which is absorbed by the pillar and is transmitted from the sleeve, thereby achieving the effect of heat dissipating. In assembling the present invention, the sleeve is first sheathed on the circumference of pillar, and then the stand and heat sinks are orderly sheathed on the circumference of sleeve, respectively. As the inner diameter of sleeve is smaller than the outer diameter of wider part at the lower end of pillar, the sleeve will be first locked on the circumference of wider part of pillar in assembling. On the other hand, diameters of round frames of the stand and the heat sinks are only a little larger than the outer diameter of sleeve and smaller than the outer diameter of chimb; therefore the stand and the heat sinks can be sheathed on the circumference of sleeve and be abutted on the chimb. At this time, if the sleeve is pressed down further, it will be expanded outward by being subjected to a squeezing of the pillar, which will in turn tighten the heat sinks, and will be fixed with the heat sinks to form an integral body. Accordingly, there is no need to paste with a glue, to weld, and to anodize, thereby decreasing an operational process. As the sleeve of present invention is directly expanding outward, it can accurately and firmly accomplish the assembling of heat sinks to solve the aforementioned problems, save a labor time, reduce a cost, and increase the productivity, as well as extenuate pollution to the environment.

Accordingly, the primary object of present invention is to provide a sleeve-tightening heat dissipating module wherein the pillar is expanding the sleeve to tighten the heat sinks for fixing into an integral body, thereby being easy to assemble and increasing a speed of production.

Another object of the present invention is to provide a sleeve-tightening heat dissipating module which can reduce a cost of manufacturing by saving a labor time and decreasing a manufacturing process.

Still another object of the present invention is to provide a sleeve-tightening heat dissipating module which can extenuate pollution to the environment without requiring an anodizing and welding, by a structural design in which the pillar is expanding the sleeve.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
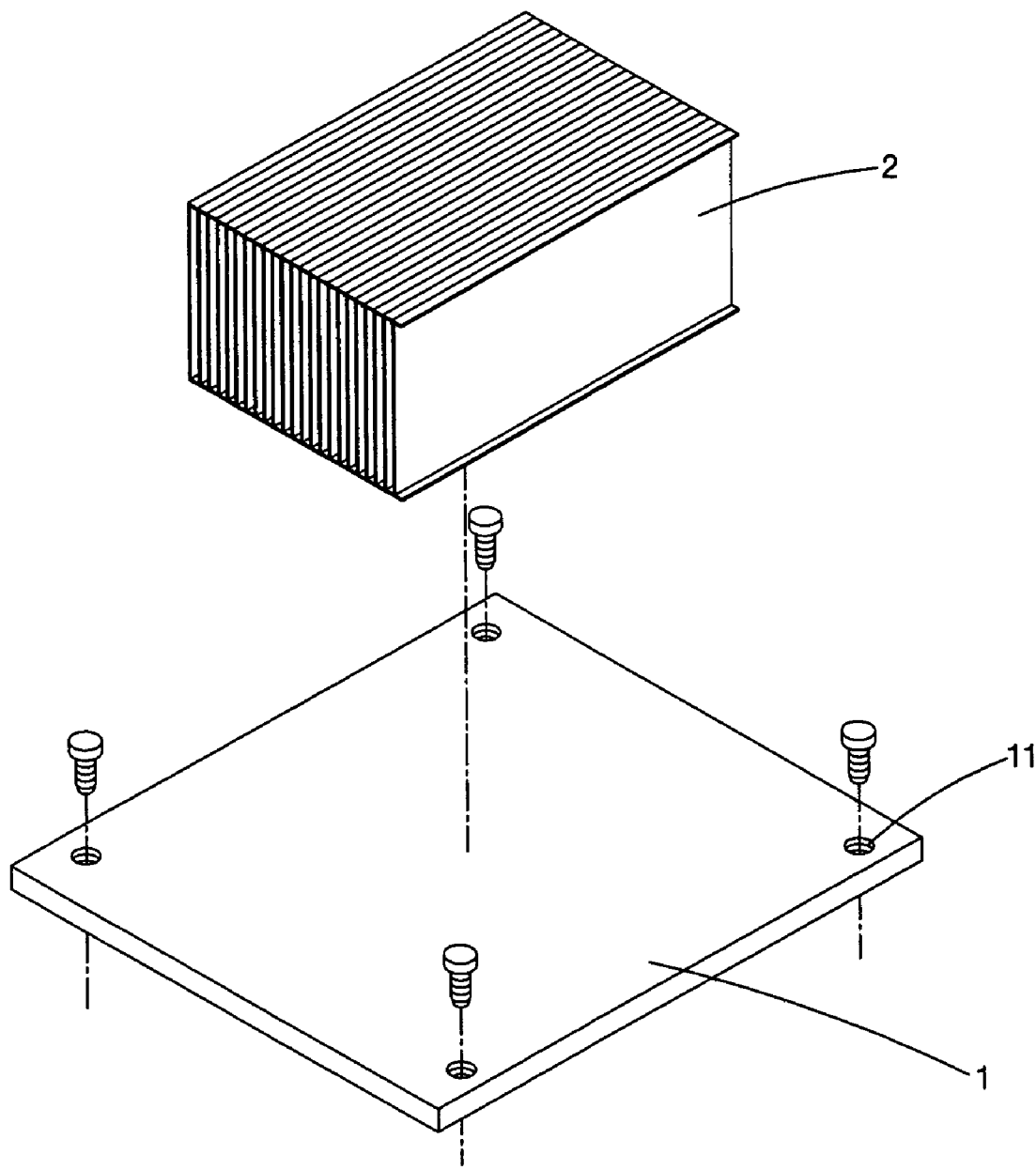
FIG. 1 shows an exploded view of a conventional heat dissipating device.
Figure 2:
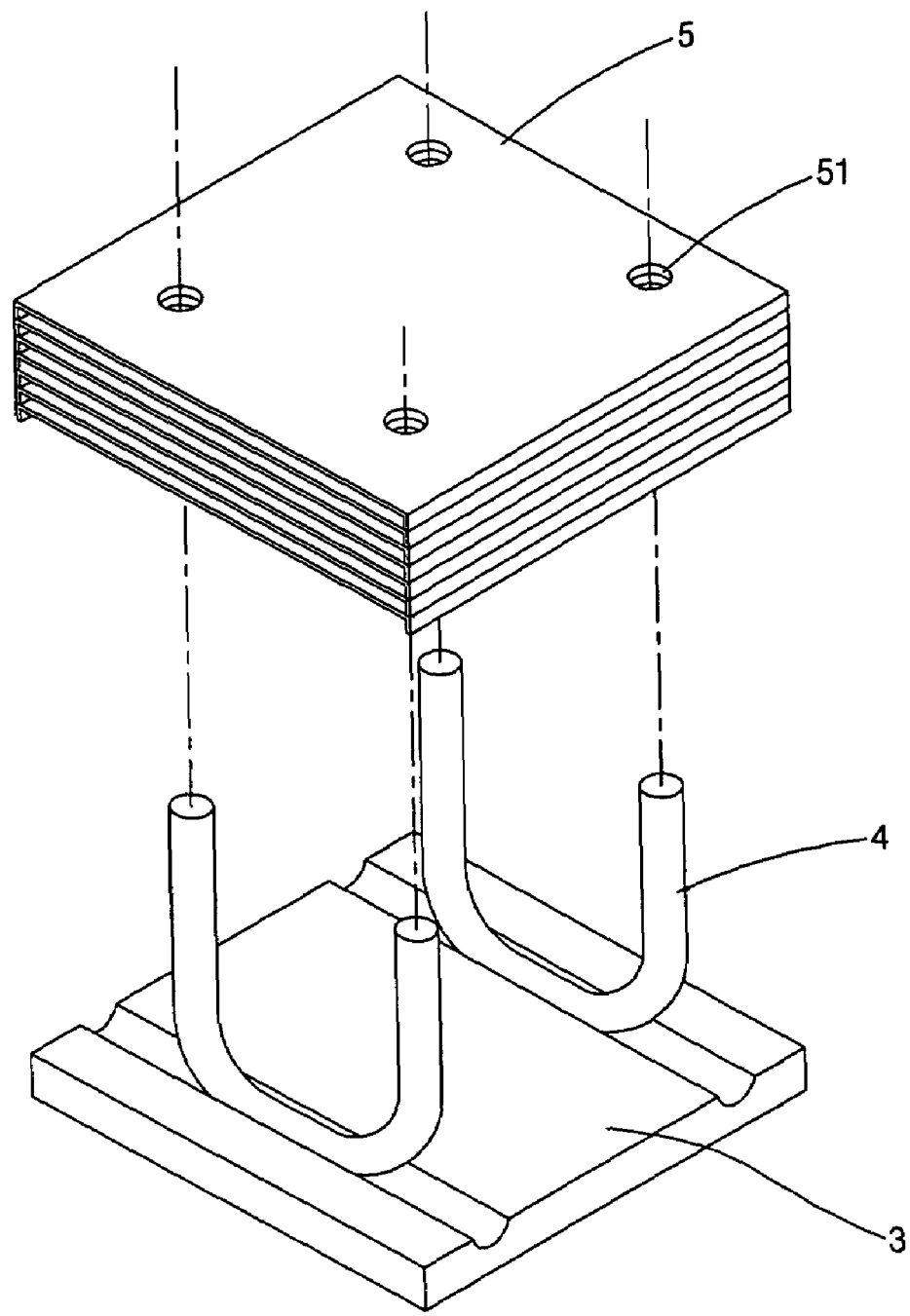
FIG. 2 shows an exploded view of another conventional heat dissipating device.
Figure 3:
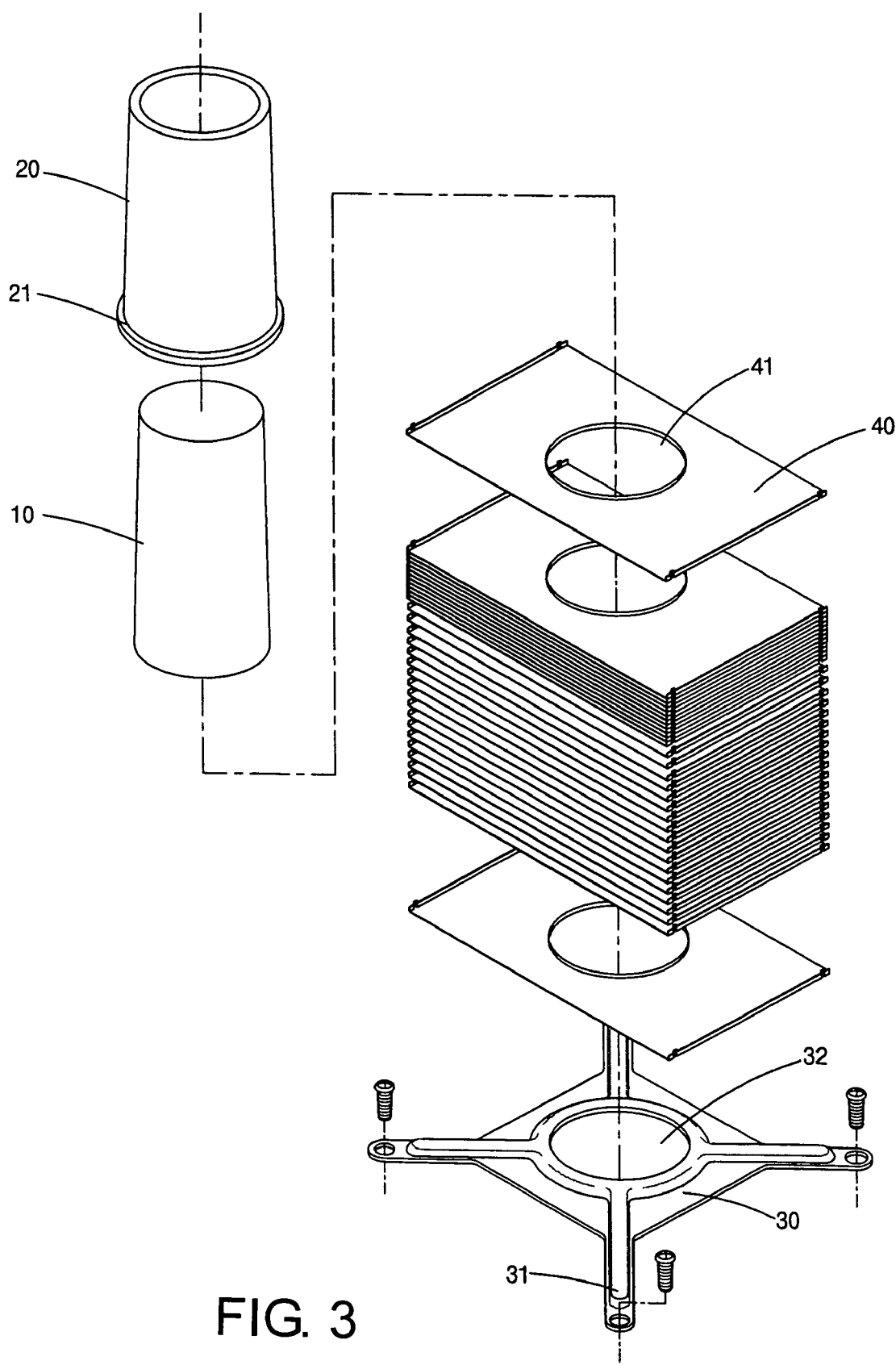
FIG. 3 shows an exploded view of an embodient of the present invention.
Figure 4:
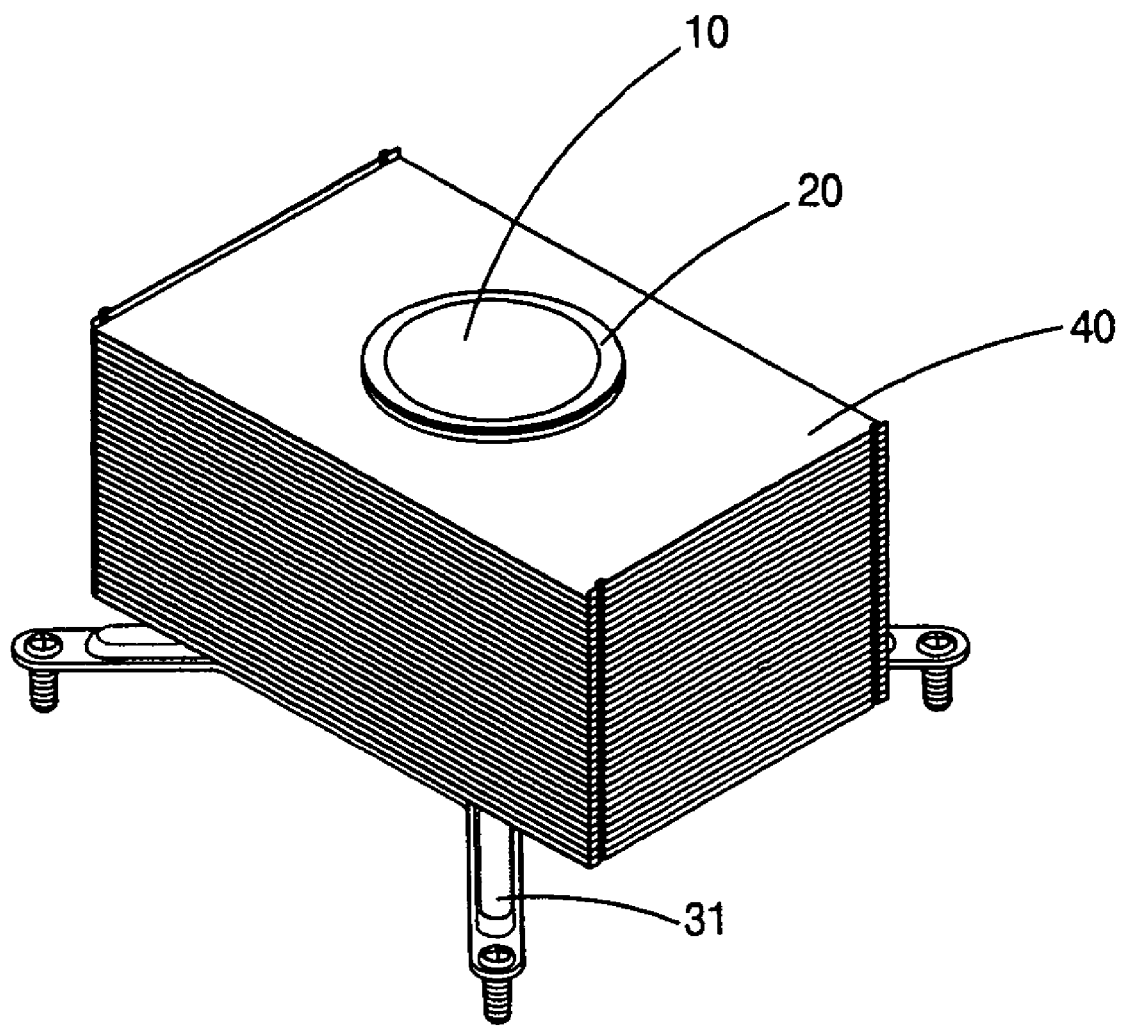
FIG. 4 shows a prospective view of an embodient of the present invention.

Referring to FIG. 3 and FIG. 4, a sleeve-tightening heat dissipating module of the present invention comprises primarily a pillar 10, a sleeve 20, a stand 30, and heat sinks 40.

The pillar 10 is a cylindrical body which is wider at a lower part, and is made by a solid metallic material.

The sleeve 20 is a hollow cylinder which is wider at a lower part, and is also made by a metallic material. An inner diameter of the sleeve 20 is smaller than an outer diameter of a wider part at a lower end of the pillar 10, such that the sleeve 20 can be only locked on a top end of circumference of wider part of the pillar 10, yet is still provided with a certain flexibility for expanding, when it is enclosed at the circumference of pillar 10. A bottom rim of the sleeve 20 is provided with a chimb 21 which forms an outer flange, and a top end of which can be sheathed and stacked with the stand 30 and the heat sinks 40.

The stand 30 is provided with stabilizers 31 at its four ends, respectively. The stabilizers 31 are provided with screw holes for being fixed on an electronic part which is assembled on a motherboard. A center of the stand 30 is provided with a round frame 32, and an inner diameter of the round frame 32 is only a little larger than an outer diameter of the sleeve 20, so as to be exactly sheathed on the circumference of sleeve 20 and be abutted on its chimb 21.

The heat sinks 40 are a module of heat sinks formed by a locking method, and are also provided with round frames 41 with inner diameters being only a little larger than the outer diameter of sleeve 20. After being stacked into a module by a multiple punching, the heat sinks 40 are sheathed on the circumference of sleeve 20 and a top end of the stand 30, for expelling out heat absorbed by the pillar 10 and transmitted from the sleeve 20, in order to achieve a heat dissipating effect.

Figure 5:
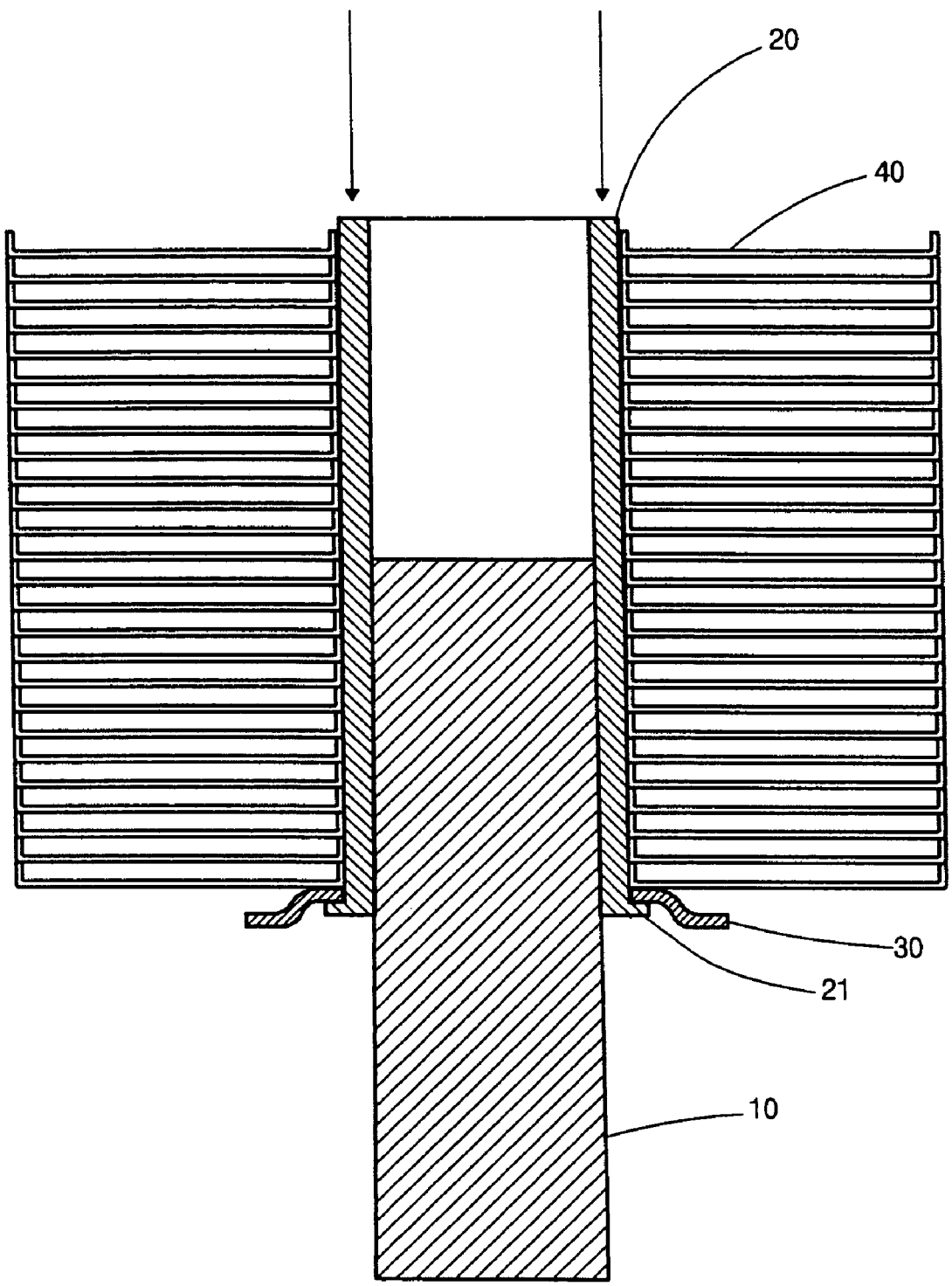
FIG. 5 shows a cross sectional view of an embodient of the present invention in assembling.
Figure 6:
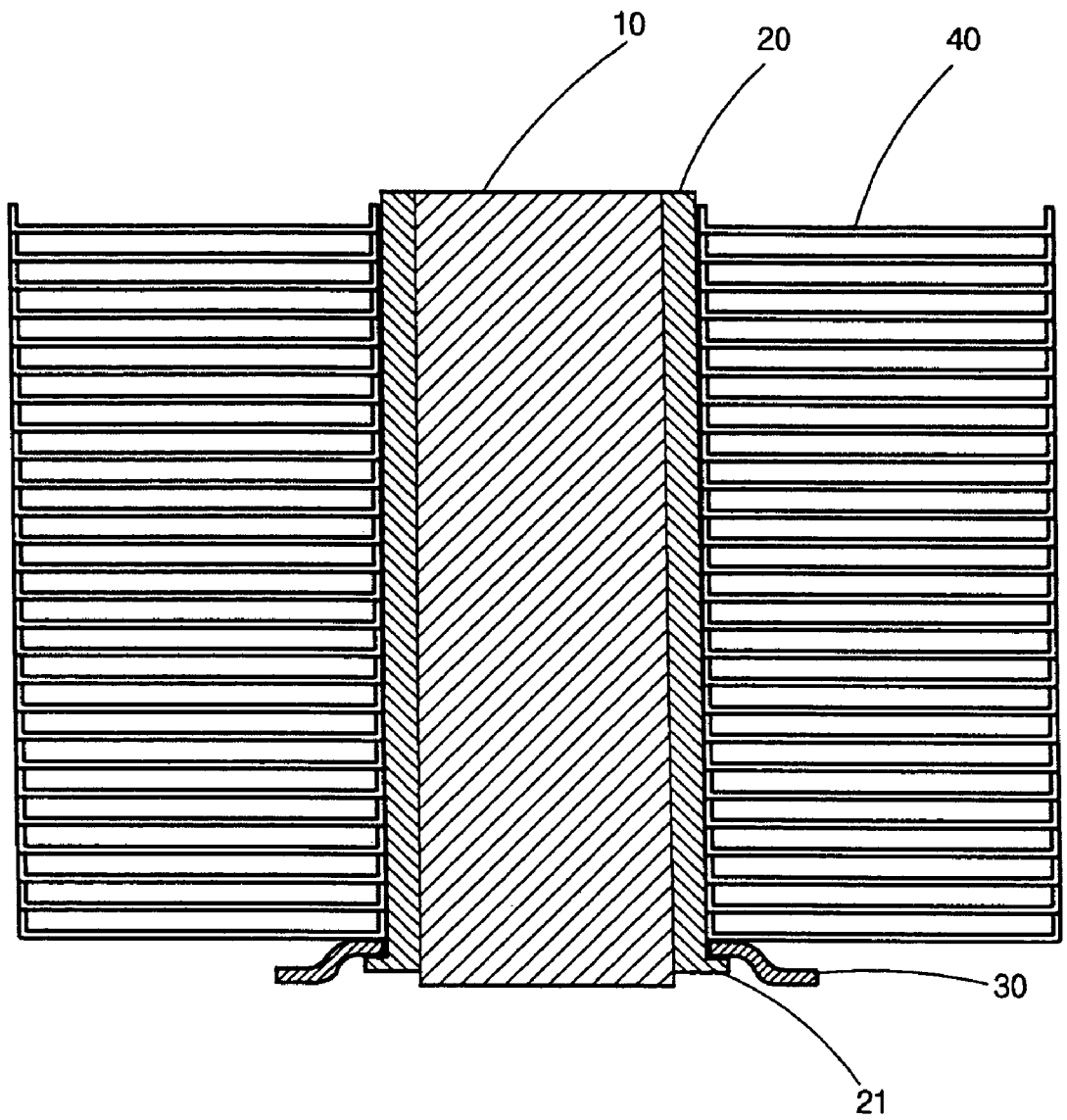
FIG. 6 shows a cross sectional view of an embodient of the present invention after being assembled.

Referring to FIG. 5 and FIG. 6, in assembling the present invention, the sleeve 20 is first sheathed on the circumference of pillar 10, and then the stand 30 and the heat sinks 40 are orderly sheathed on the circumference of sleeve 20, respectively. As the inner diameter of sleeve 20 is smaller than the outer diameter of wider part at a lower end of the pillar 10, the sleeve 20 will be first locked at the circumference of wider part of pillar 10. On the other hand, the inner diameters of round frames 31, 41 of the stand 30 and the heat sinks 40 are only a little larger than the outer diameter of sleeve 20 and smaller than an outer diameter of the chimb 21, the stand 30 and the heat sinks 40 can be sheathed on the circumference of sleeve 20 and be abutted on the chimb 21. At this time, if the sleeve 20 is pressed downward, the hollow sleeve 20 will be expanded outward due to a squeezing of the solid pillar 10, which in turn will tighten and abut the heat sinks 40, thereby fixing the pillar 10, the sleeve 20, and the heat sinks 40 to accomplish the assembling.

Furthermore, after assembling with the heat sinks 40 by the expansion and squeezing, a tight connection status is formed among the heat sinks 40, the sleeve 20, and the pillar 10. Therefore, when a bottom end of the pillar 10 is abutted on a heat-generating electronic part, the pillar 10 can quickly conduct heat to the sleeve 20 which can also quickly conduct the heat to the heat sinks 40 for quickly dissipating the heat, thereby achieving a best effect of heat conduction and dissipation.

It is worth to be mentioned that a size of the pillar 10 and a quantity of the heat sinks 40 can be adjusted according to a size of motherboard and electronic parts to be assembled. Therefore, the present invention will not be limited to a single kind of machine and is suitable for many kinds of motherboards or all kinds of electronic parts.

Accordingly, the sleeve-tightening heat dissipating module of present invention is a reasonably sound invention, which is provided with a fine practicability, and is a unique invention in a design of structural space. In addition, the heat sinks structure which is assembled by using a technique of expansion and squeezing with the pillar can apparently decrease an operational process to increase a speed of assembling the heat dissipating device and can also extenuate the pollution to environment, which is a breaking-through invention and is thus provided with the advancement.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A sleeve-tightening heat dissipating module comprising: a pillar, a sleeve, a stand, and heat sinks, wherein the pillar is a solid cylinder with a lower part being wider than a top part thereof; the sleeve is a hollow cylindrical tube with a lower part being wider than a top part thereof, the pillar is inserted in the sleeve, the sleeve is provided with an inner diameter which is smaller than an outer diameter of the lower end of the pillar, and the sleeve is provided with a flange at a bottom rim thereof, a top end of the sleeve is inserted into the stand and the heat sinks; the stand is provided with stabilizers and a round frame having an inner diameter being larger than an outer diameter of the sleeve, the stand abuts the flange; the heat sinks are a module having a plurality of plates, each of the plurality of plates has a round frame located at a center thereof and an inner diameter being larger than the outer diameter of sleeve, the heat sinks are stacked on a top end of the stand to expel heat absorbed by the pillar and transmitted from the sleeve.

2. The sleeve-tightening heat dissipating module according to claim 1, wherein the pillar is preferably to be made by a copper material.

3. The sleeve-tightening heat dissipating module according to claim 1, wherein the sleeve is preferably to be made by an aluminum material.

4. The sleeve-tightening heat dissipating module according to claim 1, wherein the heat sinks can be first formed into a module by a locking method.

* * * * *